United States Patent
Yoshioka et al.

(10) Patent No.: US 9,185,772 B2
(45) Date of Patent: Nov. 10, 2015

(54) LIGHT-EMITTING ELEMENT AND DISPLAY DEVICE

(75) Inventors: Toshihiro Yoshioka, Kawasaki (JP); Toshiharu Uchida, Yonezawa (JP)

(73) Assignee: PIONEER CORPORATION, Kanagawa (JP)

( * ) Notice: Subject to any disclaimer, the term of this patent is extended or adjusted under 35 U.S.C. 154(b) by 154 days.

(21) Appl. No.: 13/376,453

(22) PCT Filed: Jul. 28, 2009

(86) PCT No.: PCT/JP2009/003547
§ 371 (c)(1),
(2), (4) Date: Dec. 28, 2011

(87) PCT Pub. No.: WO2011/013168
PCT Pub. Date: Feb. 3, 2011

(65) Prior Publication Data
US 2012/0138975 A1 Jun. 7, 2012

(51) Int. Cl.
*H01L 27/32* (2006.01)
*H05B 33/14* (2006.01)
*H01L 51/50* (2006.01)
*H01L 51/52* (2006.01)

(52) U.S. Cl.
CPC .......... *H05B 33/145* (2013.01); *H01L 27/3211* (2013.01); *H01L 51/5048* (2013.01); *H01L 51/5265* (2013.01); *H05B 33/14* (2013.01); *H01L 2251/5315* (2013.01)

(58) Field of Classification Search
CPC .......................... H01L 27/3211; H01L 33/145
USPC ............................................ 257/40; 313/504
See application file for complete search history.

(56) References Cited

U.S. PATENT DOCUMENTS

| 6,406,801 | B1 | 6/2002 | Tokito et al. |
| 7,008,078 | B2 * | 3/2006 | Shimizu et al. ............... 362/231 |
| 2006/0232196 | A1 | 10/2006 | Hachiya et al. |
| 2007/0001588 | A1 * | 1/2007 | Boroson et al. ............... 313/504 |
| 2008/0180024 | A1 * | 7/2008 | Kwon ........................... 313/504 |
| 2008/0258609 | A1 * | 10/2008 | Nakamura ..................... 313/504 |

FOREIGN PATENT DOCUMENTS

| EP | 1 750 488 | 2/2007 |
| JP | 11-288786 | 10/1999 |
| JP | 2003-123987 | 4/2003 |
| JP | 2007-280677 | 10/2007 |
| WO | WO 2005/112521 | 11/2005 |

OTHER PUBLICATIONS

International Search Report, PCT/JP2009/003547, Oct. 27, 2009.

* cited by examiner

*Primary Examiner* — Matthew Reames
(74) *Attorney, Agent, or Firm* — Young & Thompson

(57) ABSTRACT

A light-emitting element and a display device having a resonator structure which has a small luminance fluctuation, even if a film thickness is deviated from a designed value, thereby resulting in a variation in resonator optical path length. There are included: a first reflective member; a second reflective member; and a light-emitting layer provided therebetween, and there is provided a resonator structure that transmits part of light by the first reflective member or the second reflective member, the light being resonated between the first reflective member and the second reflective member. The resonator structure has at least two or more resonance spectral peaks at respective wavelengths in a visible light range with a wavelength of a maximum value relative luminosity being a border line and an emission output spectrum has at least two or more peaks at respective wavelengths based on the resonance spectral peaks.

4 Claims, 10 Drawing Sheets

LIGHT-EMITTING ELEMENT AND DISPLAY DEVICE

TECHNICAL FIELD

The present invention relates to a light-emitting element and a display device.

BACKGROUND ART

As a light-emitting element forming a display device such as a display unit or an illuminating device, there has been known an EL element utilizing a substance which self-emits light in the presence of an applied voltage due to an electroluminescence (EL) phenomenon. The EL element is a thin-film light-emitting element including a light-emitting layer which is provided between an upper electrode and a lower electrode and is made of an organic material or an inorganic material. The EL element has a structure such that the upper and lower electrodes apply a voltage to the light-emitting layer so as to cause light emission.

In recent years, there has been developed a light-emitting element having a resonator structure (what is referred to as a microcavity structure) in which light emitted in the light-emitting layer is resonated by using a total reflection mirror as one of the upper electrode and the lower electrode and using a semi-transmissive mirror that transmits light at some of wavelengths as the other electrode (see Patent Literature 1, for example).

Patent Literature 1 discloses a blue light-emitting element including a light-emitting layer formed from a light-emitting material having internal emission spectral peaks (a first peak and a second peak) in a blue wavelength range and a green to red wavelength range, respectively, and a resonator structure having a single resonance spectral peak in the blue wavelength range. The blue light-emitting element of Patent Literature 1 outputs the first and second peaks while strengthening the first peak in the blue wavelength range and weakening the second peak in the green to red wavelength range by the resonator structure.

The technique disclosed in Patent Literature 1 may be effective for a display device such as a large display which requires wide viewing angle characteristics. However, in a personally-used small display such as a mobile terminal, a personal computer, or a car navigation system, in some cases a variation in luminance in a front direction cannot be tolerated.

That is, in a case where the resonator structure is employed, a luminance in the front direction increases due to its filter characteristics and strong directional characteristics of an emission output. A personally-used display device which does not require wide viewing angle characteristics, for example, utilizes such directional characteristics. Therefore, as compared to a television set which requires a wide viewing angle, the personally-used display device requires a less variation in luminance in the front direction. In a thin-film light-emitting element having such a resonator structure, however, the filter characteristics thereof are sensitive to a distance between mirrors (a resonator optical path length), and in some cases chromatic coordinates (color purity) or a luminance fluctuation in the front direction cannot be tolerated if a variation occurs in the resonator optical path length due to a manufacturing error in the manufacturing process. In the case of the light-emitting element disclosed in Patent Literature 1, a luminance fluctuation due to an increase or a decrease in resonator optical path length is large. As a result, in some cases a variation in luminance in the front direction cannot be tolerated.

CITATION LIST

Patent Literature

Patent Literature 1: International Publication No. WO2005/112521

SUMMARY OF INVENTION

Technical Problem

That is, examples of a problem to be solved by the present invention include the above-described problem. Therefore, examples of an object of the present invention include providing a technique capable of suppressing a luminance fluctuation even if a film thickness is deviated from a designed value, thereby resulting in an increase or a decrease in a resonator optical path length, for example, in a light-emitting element and a display device having a resonator structure.

Solution to Problem

As described in claim 1, a light-emitting element of the present invention has: a first reflective member; a second reflective member; and a light-emitting layer provided between the first reflective member and the second reflective member, and includes a resonator structure that transmits part of light by the first reflective member or the second reflective member, the light being resonated between the first reflective member and the second reflective member. The light-emitting element is characterized in that the resonator structure has at least two or more resonance spectral peaks at respective wavelengths in a visible light range with a wavelength at which a relative luminosity takes a maximum value being a border line, and an emission output spectrum has at least two or more peaks at respective wavelengths based on the resonance spectral peaks.

As described in claim 9, a display device of the present invention has: a first reflective member; a second reflective member; and a light-emitting layer provided between the first reflective member and the second reflective member, and includes a number of resonator structures that transmit part of light by the first reflective member or the second reflective member, the light being resonated between the first reflective member and the second reflective member. The display device is characterized in that the resonator structure has at least two or more resonance spectral peaks at respective wavelengths in a visible light range with a wavelength at which a relative luminosity takes a maximum value being a border line, and an emission output spectrum has at least two or more peaks at respective wavelengths based on the resonance spectral peaks.

Figure 1:
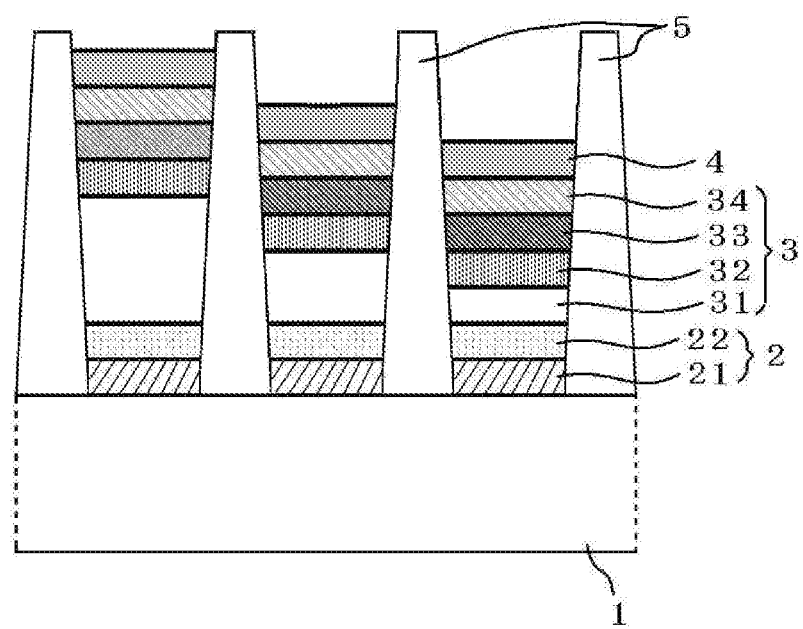
FIG. 1 is a vertical cross-sectional view of light-emitting elements according to a preferred first embodiment of the present invention.

REFERENCE SIGNS LIST 1 substrate
2 anode
3 organic layer
31 hole-injection layer
32 hole transport layer
33 EL light-emitting layer
34 electron transport layer
4 cathode
5 partition wall

DESCRIPTION OF EMBODIMENTS

Hereinafter, a light-emitting element and a display device according to preferred embodiments of the present invention will be described in detail with reference to the accompanying drawings. The following description is directed to, as an example, a display device including light-emitting elements which emit lights of red (R), green (G), and blue (B), respectively. Note however that the embodiments to be described below shall not be construed to limit the technical scope of the present invention.

(First Embodiment)

Figure 2:
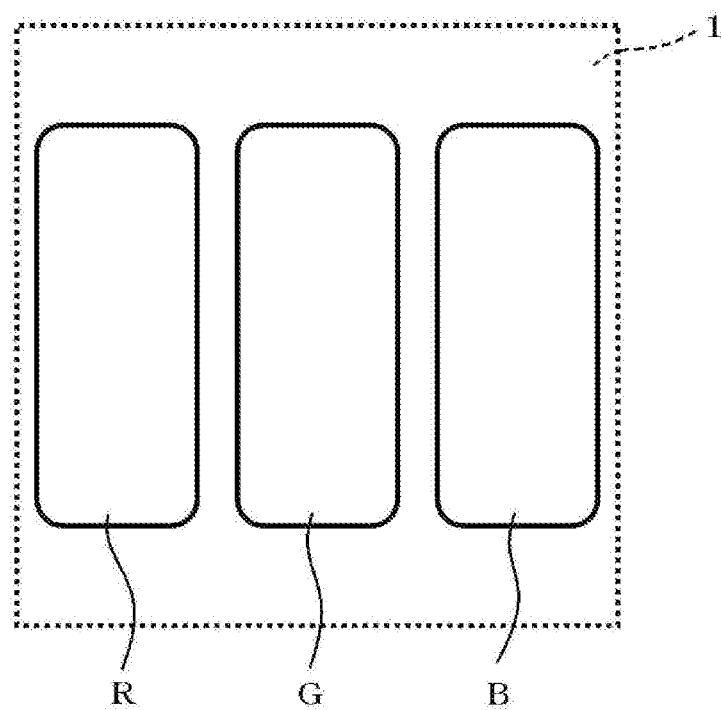
FIG. 2 is a plan view of the light-emitting elements according to the preferred first embodiment of the present invention.

FIGS. 1 and 2 show an example where an RGB unit is formed by arranging three light-emitting elements (R, G, B) which emit lights of red (R), green (G), and blue (B) on a common substrate 1. FIG. 1 is a vertical cross-sectional view of the light-emitting elements (R, G, B), and FIG. 2 is a plan view thereof. Note that the actual display device is configured such that a number of light-emitting elements (R, G, B) are arranged on the substrate 1 to form a display area, and the light-emitting elements are passively driven by a drive circuit which is not shown in the drawings and disposed outside the display area or actively driven by arranging a drive circuit for each element.

As shown in FIG. 1, the light-emitting elements (R, G, B) according to the present embodiment each have a so-called top emission structure in which an anode 2 as a first reflective member, an organic layer 3, and a cathode 4 as a second reflective member are stacked on the substrate, and light emission is taken out from a surface side where the films are formed. These RGB light-emitting elements are partitioned by partition walls 5 called banks. Note that in some cases an organic layer or an inorganic layer such as a sealing film is further stacked on the cathode 4. Furthermore, although not shown in the drawings, a film or a substrate for preventing the reflection of outside light may be further stacked.

The anode 2 has a two-layered structure having a reflective electrode 21 and a transparent electrode 22. As a material of the anode 2 to be in contact with a hole-injection layer 31, a material having a high work function is used. Specifically, as a material for the reflective electrode 21, a metal such as Al, Cr, Mo, Ni, Pt, Au, or Ag, an alloy or intermetallic compound containing these metals, or the like may be used, for example. A thickness of the reflective electrode 21 is 100 nm, for example. The reflective electrode 21 preferably has a high reflectance, i.e., an average value of reflectances for light with a wavelength of 400 to 700 nm is 80% or more. Moreover, as a material for the transparent electrode 22, a metal oxide such as ITO (indium tin oxide) or IZO (indium zinc oxide), or the like, can be used, for example. A thickness of the transparent electrode 22 is 75 nm, for example. Note that although FIGS. 1 and 2 omit the illustration thereof, an extraction electrode (wiring electrode) is connected to the anode 2. Note that the anode 2 may have a single-layer structure with the reflective electrode 21.

Part of the organic layer 3 may be formed by an inorganic material. Moreover, the organic layer 3 may be further divided to have more layers, or the number of layers in the organic layer 3 can be reduced by making a single layer have functions of a plurality of layers. The organic layer 3 shown in FIG. 1 has a multilayer structure in which the hole-injection layer 31, a hole transport layer 32, a light-emitting layer 33, and an electron transport layer 34 are stacked in this order from the anode 2 side. Although it is only necessary that the organic layer 3 has at least the light-emitting layer 33, it is preferred to arrange the hole-injection layer 31, the hole transport layer 32, the electron transport layer 34, and the like in order to efficiently facilitate an electroluminescence phenomenon.

In a case where a resonator structure is employed, each of the RGB light-emitting elements has a preferable resonator optical path length. In a case of the structure in FIG. 1, a distance between the reflective electrode 21 and a reflective surface of the cathode 4 is a resonator optical path length. As an example, a stacked film thickness to obtain a preferable resonator optical path length for red (R) is 300 nm, a stacked film thickness to obtain a preferable resonator optical path length for green (G) is 235 nm, and a stacked film thickness to obtain a preferable resonator optical path length for blue (B) is 200 nm. These resonator optical path lengths are adjusted by a film thickness of the organic layer 3, for example. Note however that it is difficult to completely prevent a film thickness from deviating from its designed value in the manufacturing process as mentioned previously. It is difficult to control a film thickness particularly when the organic layer 3 is formed by a coating method. For example, in a case where a film is formed by an ink jet method, in some cases a 5% or more variation in film thickness occurs between elements.

As an example, the structure shown in FIG. 1 is obtained by adjusting a resonator optical path length by changing a thickness of the hole-injection layer 31. Specifically, the thickness (designed value) of the hole-injection layer 31 for red (G) is 125 nm, for example, the thickness (designed value) of the hole-injection layer 31 for green (G) is 65 nm, for example, and the thickness (designed value) of the hole-injection layer 31 for blue (B) is 20 nm, for example. The hole transport layers 32, the light-emitting layers 33, and the electron transport layers 34 are configured to have the same thicknesses in the RGB resonator structure. The thickness (designed value) of the hole transport layer 32 is 30 nm, for example, the thickness (designed value) of the light-emitting layer 33 is 30 nm, for example, and the thickness (designed value) of the electron transport layer 34 is 40 nm, for example.

For the hole-injection layer 31 and the hole transport layer 32, it is only necessary that they are formed of a material having an excellent hole transport property. Examples of usable organic materials include a phthalocyanine compound such as copper phthalocyanine (CuPc), a starburst type amine such as m-MTDATA, a multimer of a benzidine type amine, an aromatic tertiary amine such as 4,4'-bis[N-(1-naphthyl)-N-phenylamino]-biphenyl (NPB) or N-phenyl-p-phenylene-diamine (PPD), a stilbene compound such as 4-(di-P-tolylamino)-4'-[4-(di-P-tolylamino)styryl]stilbenzene, a triazole derivative, a styrylamine compound, and a fullerene such as a buckyball or $C_{60}$. Alternatively, it is possible to use a polymer-dispersed material in which a low-molecular material is dispersed in a high-molecular material such as polycarbonate. Note however that the materials are not limited thereto.

As the light-emitting layer 33, a material producing an electroluminescence phenomenon for red (R), green (G), or blue (B) can be used. Examples of the material for the light-emitting layer 33 include a fluorescent organometallic compound such as (8-hydroxyquinolinate)aluminum complex ($Alq_3$), a fluorescent organic material such as an aromatic dimethylidine compound such as 4,4'-bis(2,2'-diphenylvinyl)-biphenyl (DPVBi), a styrylbenzene compound such as 1,4-bis(2-methylstyryl)benzene, a triazole derivative such as 3-(4-biphenyl)-4-phenyl-5-t-butylphenyl-1,2,4-triazole (TAZ), an anthraquinone derivative, or a fluonorene derivative, and a phosphorescent organic material such as a polymeric material of polyparaphenylene vinylene (PPV) base, polyfluorene base, or polyvinylcarbazole (PVK) base, and a platinum complex or an iridium complex. Note however that the materials are not limited thereto. The light-emitting layer 33 is not necessarily required to be an organic material, and an inorganic material producing an electroluminescence phenomenon may be used.

It is only necessary that the electron transport layer 34 is formed of a material having an excellent electron transport property. Examples of the usable material include an organic material such as a silacyclopentadiene (silole) derivative such as PyPySPyPy, a nitro-substituted fluorenone derivative, and an anthraquinodimethane derivative, a metal complex of an 8-quinolinole derivative such as tris(8-hydroxyquinolinate) aluminum ($Alq_3$), metal phthalocyanine, a triazole-based compound such as 3-(4-biphenyl)-5-(4-t-butylphenyl)-4-phenyl-1,2,4-triazole (TAZ), an oxadiazole-based compound such as 2-(4-biphenylyl)-5-(4-t-butyl)-1,3,4-oxadiazole (PBD), and a fullerene such as a buckyball, $C_{60}$, and a carbon nanotube. Note however that the materials are not limited thereto.

As a material for the cathode 4, a material having a low work function in an area in contact with the electron transport layer 34 and having small reflection and transmission losses in the entire cathode can be used. Specifically, as a material for the cathode 4, a metal such as Al, Mg, Ag, Au, Ca, or Li or a compound thereof, or an alloy containing those can be used in a form of a single layer or layers stacked on top of another. Moreover, there may be a case where thin lithium fluoride, lithium oxide, or the like is formed in the area in contact with the electron transport layer 34 so as to control the electron injection characteristics. The thickness of the cathode 4 is 10 nm, for example. As mentioned previously, the present embodiment has a top emission structure in which light is outputted from the surface side where the films are formed, i.e., the cathode side. Therefore, the cathode 4 is a semi-transmissive electrode whose average value for transmittances for light with a wavelength of 400 to 700 nm is 20% or more, for example. The transmittance can be adjusted by a film thickness of the electrode, or the like, for example. Note that although the illustration thereof is omitted in FIGS. 1 and 2, an extraction electrode (wiring electrode) is connected to the cathode 4.

In a case where a sealing film is further stacked on the cathode 4, the sealing film can be formed of a transparent inorganic material having a small moisture vapor or oxygen transmittance, for example. Examples of usable material for the sealing film include silicon nitride (SiNx), silicon oxynitride (SiOxNy), aluminum oxide (AlOx), aluminum nitride (AlNx), and the like.

An example of usable material for the partition wall 5 called bank is a photosensitive resin containing a fluorine component. By containing a fluorine component, a liquid-repellency against a liquid material can be exerted. Therefore, it is possible to suppress liquid flow (what is called overlap) in a case where a film is formed by a coating method. Furthermore, the partition wall 5 is preferably formed of a material having a light shielding property.

As compared to the light-emitting element for green (G), a luminance of the light-emitting element for blue (B) or red (R) in the front direction is more likely to have an unallowable luminance fluctuation due to an increase or a decrease in luminosity caused by a shift in peak wavelength. Among them, blue (B) has a greater luminance fluctuation than red (R) with respect to a fluctuation in resonator optical path length. Therefore, for the light-emitting element for blue (B), the present embodiment suppresses a fluctuation in luminance in the front direction even if the film thickness has deviated from the designed value in the manufacturing process to cause an increase or a decrease in the resonator optical path length. As a structure therefor, an internal emission spectrum, a relative luminosity spectrum, and a resonator output spectrum are made to satisfy conditions to be described below.

Note that the internal emission spectrum corresponds to a photoluminescence (PL) spectrum of a light-emitting material. The resonance spectrum corresponds to resonator filter characteristics. The resonator output spectrum corresponds to a spectrum of light transmitted from the resonator structure (the cathode in a case of FIG. 1). The emission output spectrum corresponds to a spectrum of light outputted from the light-emitting element. The wavelength at which the relative luminosity becomes maximum is 555 nm on the basis of photopic vision, for example.

Figure 3:
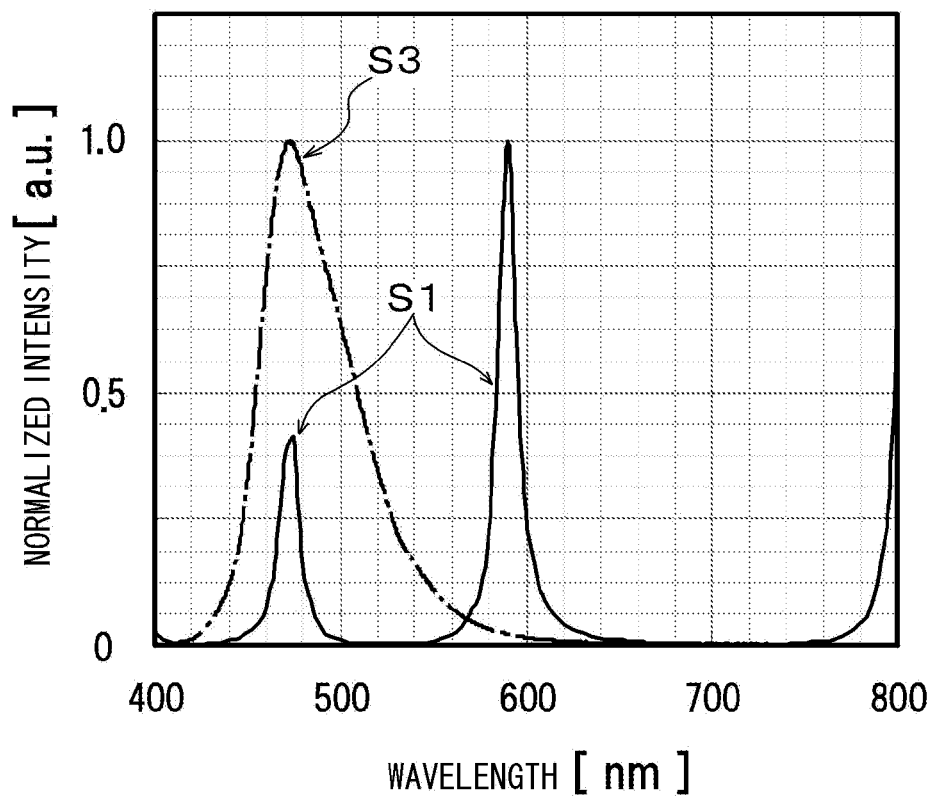
FIG. 3 is a diagram showing light spectra for blue (B).
Figure 4:
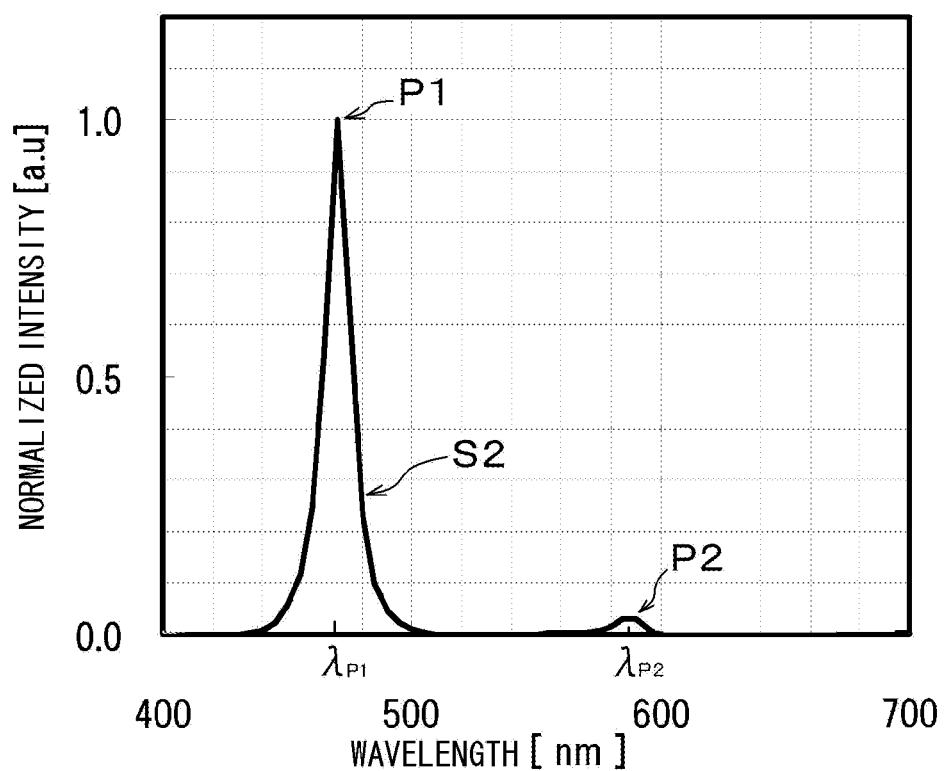
FIG. 4 is a diagram showing a relationship between a rate of change $R_E$ in emission intensity and a rate of change in luminance for blue (B).

As shown in FIG. 3, the blue light-emitting element of the present embodiment has a resonator structure such that a resonance spectrum (i.e., resonator filter characteristics) S1 has two peaks at respective wavelengths in the visible light range. Furthermore, as shown in FIG. 4, an emission output spectrum S2 has at least two peaks at respective wavelengths based on the peaks of the resonance spectrum S1, and these two peaks at respective wavelengths are positioned respectively on a short wavelength side and a long wavelength side with a central wavelength of the relative luminosity spectrum being a border line. Note that in view of absorption or reflection, or transmittance dispersion of the resonator in the stacked structure, the resonance spectrum S1 of FIG. 3 shows a slat spectrum such that intensities do not change for wavelengths in an actual simulation. Needless to say, the shapes of the spectra in the present embodiment are not limited to those shown in FIGS. 3 and 4.

In a case of the blue light-emitting element, as shown in FIG. 4, the emission output spectrum S2 has a primary peak P1 on the short wavelength side and a secondary peak P2 on the long wavelength side with the central wavelength of the relative luminosity spectrum (i.e., 555 nm on the basis of photopic vision) being a border line. Here, the central wavelength of the primary peak P1 ($\lambda_{P1}$) is preferably within a range of 470±20 nm, and the central wavelength of the secondary peak P2 ($\lambda_{P2}$) is preferably within a range of 570 to 640 nm. The secondary peak P2 according to the present embodiment has a function to cancel out a luminance fluctuation generated when the central wavelength of the primary peak P1 ($\lambda_{P1}$) is shifted toward the short wavelength side or the long wavelength side as will be described later in detail. Even when the wavelength of the secondary peak P2 is outside the above-described range, the effect of suppressing a luminance fluctuation can be obtained. In a case where the wavelength of the secondary peak P2 is outside the above-described range, however, besides the chromaticity thereof being largely deviated, there may be cases causing problems such that a strong satellite intensity is required (in a case of 560 nm, for example), and a PL spectrum having a long skirt is required on the long wavelength side, thereby reducing a light use efficiency in the resonator structure.

Note however that an emission intensity is preferred to be small in order to achieve a color purity sufficiently satisfying the standard since the secondary peak P2 has the central wavelength positioned in what is called a red wavelength range. On the other hand, if the emission intensity is too small, the cancel out effect for a luminance fluctuation becomes small. Moreover, the internal emission has an intensity also between the wavelengths $\lambda_{P1}$ and $\lambda_{P2}$, and often has a spectral shape such that as a wavelength increases toward $\lambda_{P2}$, an intensity thereof is gradually decreased. Therefore, in order for emission to reduce the loss thereof, the emission intensity of the secondary peak P2 is preferred to be smaller as much as possible. Therefore, a relative emission intensity of the secondary peak P2 with respect to the primary peak P1 is preferably 10% or smaller in view of the (integrated) intensity ratio with the primary peak P1, for example, and more preferably 1 to 5%. In a case of blue (B), for example, since the secondary peak P2 lies in a skirt of the internal emission spectrum, due to its influence, a level of a luminance increase or decrease caused by a wavelength shift becomes greater than that caused only by a luminosity. Thus, it is possible to obtain a sufficient compensating effect for a luminance fluctuation even with a small peak intensity of 1 to 5%. Moreover, in a case where the output peak for blue (B) is at a short wavelength, it is possible to obtain a desired effect with a smaller intensity ratio. Therefore, in view of the case only by a luminosity, the emission intensity of the secondary peak P2 is set to 10% or less.

As mentioned previously, in order to achieve a predetermined blue color purity, the emission intensity of the secondary peak P2 is preferred to be adequately small. However, a preferred emission intensity for compensating (canceling out) a luminance fluctuation, which is to be embodied by the present embodiment, has a wavelength dependence (i.e., a relative luminosity dependence). Therefore, as a preferred emission intensity for achieving a color purity and compensating a luminance fluctuation, the emission intensity is preferably such that a deviance Δu'v' from an NTSC color purity of chromaticity coordinates falls in a predetermined range. That is, the emission intensity is set so that regarding a color purity for a single color of blue, a deviance Δu'v' from NTSC blue coordinates falls in a range of 0.05 or smaller, and preferably in a range of 0.02 or smaller.

A design of the resonance spectrum (i.e., resonator filter characteristics) S1 for obtaining the emission output spectrum S2 satisfying the above-described conditions is performed by controlling a length of a resonator optical path length, for example. Although it depends on a material and the like, if a resonator optical path length is increased, the peak shape of the resonance spectrum S1 generally becomes steeper, and a width between the two peaks becomes narrower. In contrast, if a resonator optical path length is reduced, the peak shape of the resonance spectrum S1 becomes gentler and a width between the two peaks becomes larger. Therefore, by changing the designed value of the resonator optical path length, it is possible to design a desired peak shape of the resonance spectrum S1. Furthermore, the resonator optical path length can be adjusted by a film thickness of a layer such as the organic layer 3, which is interposed between the reflective electrode 21 and the semi-transmissive electrode 22.

According to the present embodiment, in addition to the adjustment of the resonator optical path length, it is also possible to design a desired transmission spectrum S1 by selecting a preferred light-emitting material. A preferred light-emitting material is a material having internal emission spectral peaks at the wavelengths corresponding to the two peaks of the transmission spectrum S1, for example. By selecting a light-emitting material having such an internal emission spectrum, it becomes easier to perform emission intensity control. As a preferred example, FIG. 3 shows an internal emission spectrum S3 of a light-emitting material having a strong peak in the vicinity of 470 nm and a weak peak in the vicinity of 600 nm. That is, from among the light-emitting materials described above as an example, the light-emitting layer exhibiting the above-described internal emission spectrum can be used. Note that if the wavelength of the primary peak P1 is determined, the peak position for the secondary peak P2 is also determined approximately. Therefore, it is preferred to select a material in consideration of this. Note however that the primary peak P1 and the secondary peak P2 in the present embodiment are formed based on the resonance spectrum S1, and it is therefore possible to form the primary peak P1 and the secondary peak P2 also by using a light-emitting material having a single broad internal emission spectrum. That is, types of a light-emitting material are not limited.

Figure 5:
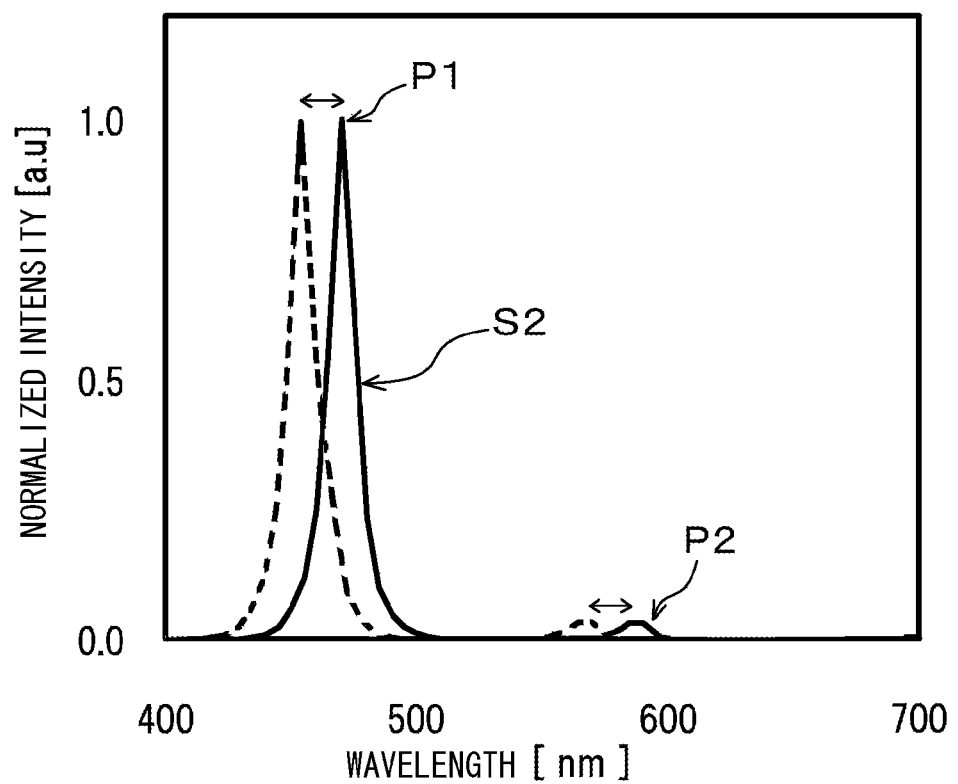
FIG. 5 is a diagram showing relationships between a change in film thickness and a front luminance value for blue (B).

According to the present embodiment, the resonator structure is configured such that the resonance spectrum S1 has two peaks in a visible light range, and furthermore, the light-emitting element is configured such that the emission output spectrum S2 has the primary peak P1 and the secondary peak P2 with the central wavelength of the relative luminosity spectrum being a border line. As a result, even if the central wavelengths of the peaks are shifted due to manufacturing errors, for example, it is possible to suppress a luminance fluctuation. That is, since the present embodiment is configured such that the primary peak P1 and the secondary peak P2 are formed based on the two peaks of the resonance spectrum S1, if the resonator optical path length is increased or decreased, the central wavelengths of the primary peak P1 and the secondary peak P2 are shifted synchronously in the same direction as schematically shown in FIG. 5. Therefore, in a case where the central wavelength of the primary peak P1 is shifted to increase or decrease the emission intensity, the central wavelength of the secondary peak P2 is also synchronously shifted to increase or decrease the emission intensity. Therefore, it is possible to cancel out and suppress the luminance changes at the respective peaks.

In contrast, if the primary peak and the secondary peak are formed based on the internal spectrum of a light-emitting material as in Patent Literature 1, for example, there is only one peak in the resonance spectrum. Therefore, although the central wavelength of the primary peak is shifted by an increase or a decrease in the resonator optical path length, the change in the central wavelength of the secondary peak is small. Therefore, an increase or a decrease in the resonator optical path length leads to a luminance fluctuation as with the case of the single peak (only the primary peak). Thus, the luminance change for an increase or a decrease in the resonator optical path length is large, and a luminance variation in the front direction is thereby emphasized.

In the resonator structure, a color purity in the front direction can be designed to have a relatively large margin. However, strict accuracy is required as to the resonator optical path length. For example, if a film thickness is changed by about 5 nm (about 5% of the entire element film thickness), in some cases the peak wavelength of the emission output spectrum is changed by as much as about 5 nm. Therefore, when the designed value of the peak wavelength is 470 nm, the luminosity in the peak wavelength (to 475 nm) shifted by the 5 nm increase in film thickness is changed by as much as 20% or more in some cases, thereby resulting in a large luminance change, i.e., a cause for a deterioration in image quality (luminance irregularity).

Figure 6:
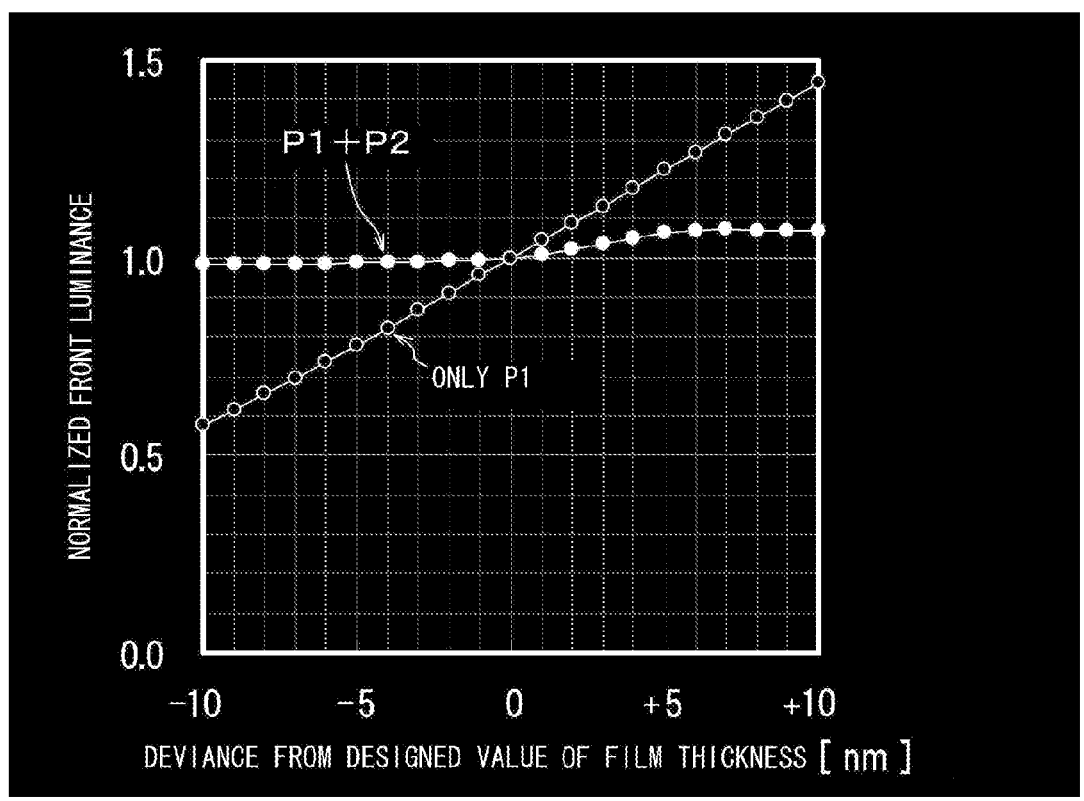
FIG. 6 is a diagram showing relationships between a deviance from a designed value of a film thickness and an emission intensity in the above-described light-emitting element.

That is, the cause creating an image quality deterioration (luminance irregularity) in the front direction lies in the relationship between the shift of the peak wavelength of the emission output spectrum S2 and the relative luminosity spectrum. Therefore, the present embodiment is configured such that the primary peak P1 and the secondary peak P2 are formed with the central wavelength of the relative luminosity spectrum being a border line, and the primary peak P1 and the secondary peak P2 are synchronously shifted by an increase or a decrease in resonator optical path length. As a result, it becomes possible to cancel out the luminance change in the primary peak P1 by the luminance change in the secondary peak P2. FIG. 6 shows simulation results about how luminance changes differ from each other between a case where the spectrum shown in FIGS. 3 and 4 has the primary peak P1 and the secondary peak P2 and a case where the spectrum does not have the secondary peak P2, but has only the primary peak P1. As can be seen from these simulations, it is possible to suppress a luminance fluctuation by the configuration as in the present embodiment.

Note that although the first and second reflective members are formed by the reflective electrode and the semi-transmissive electrode in the light-emitting element shown in FIG. 1, the present invention is not limited thereto. A reflective film different from an electrode may be formed. In such a case, an anode and a cathode on the side of the element having the reflective film different from an electrode are preferably transparent electrodes.

(Second Embodiment)

Figure 7:
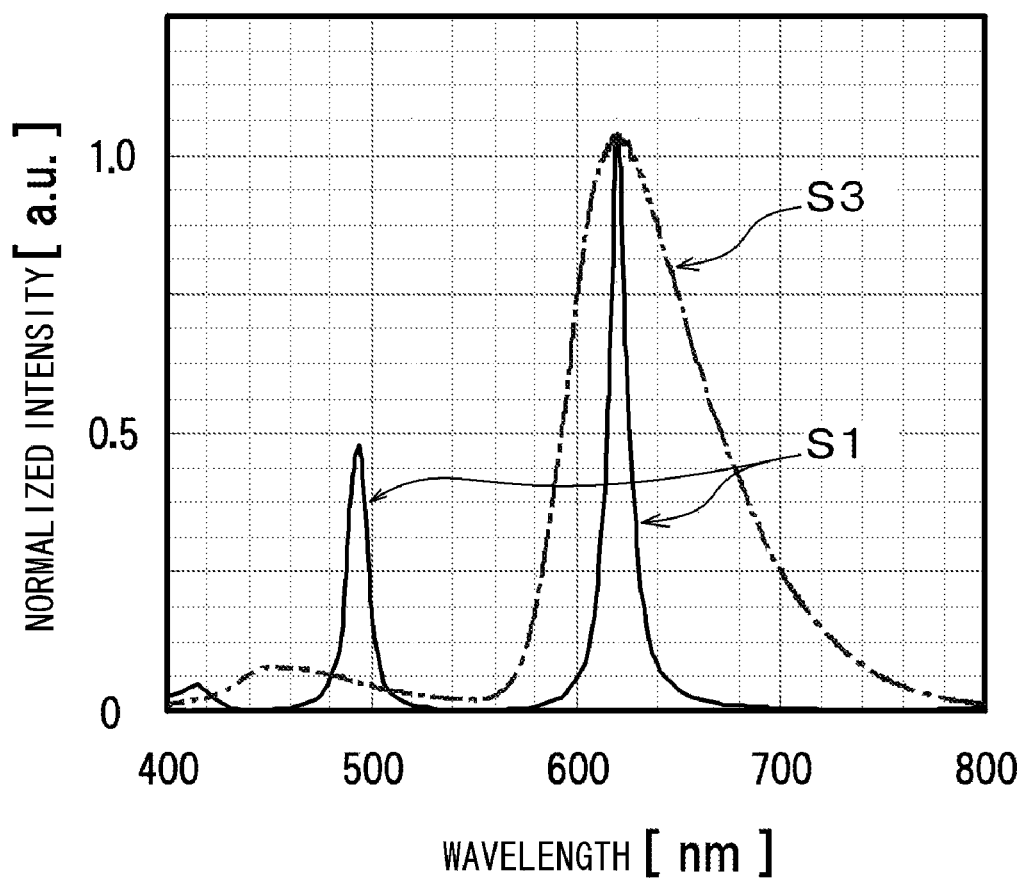
FIG. 7 is a diagram showing light spectra for red (R).
Figure 8:
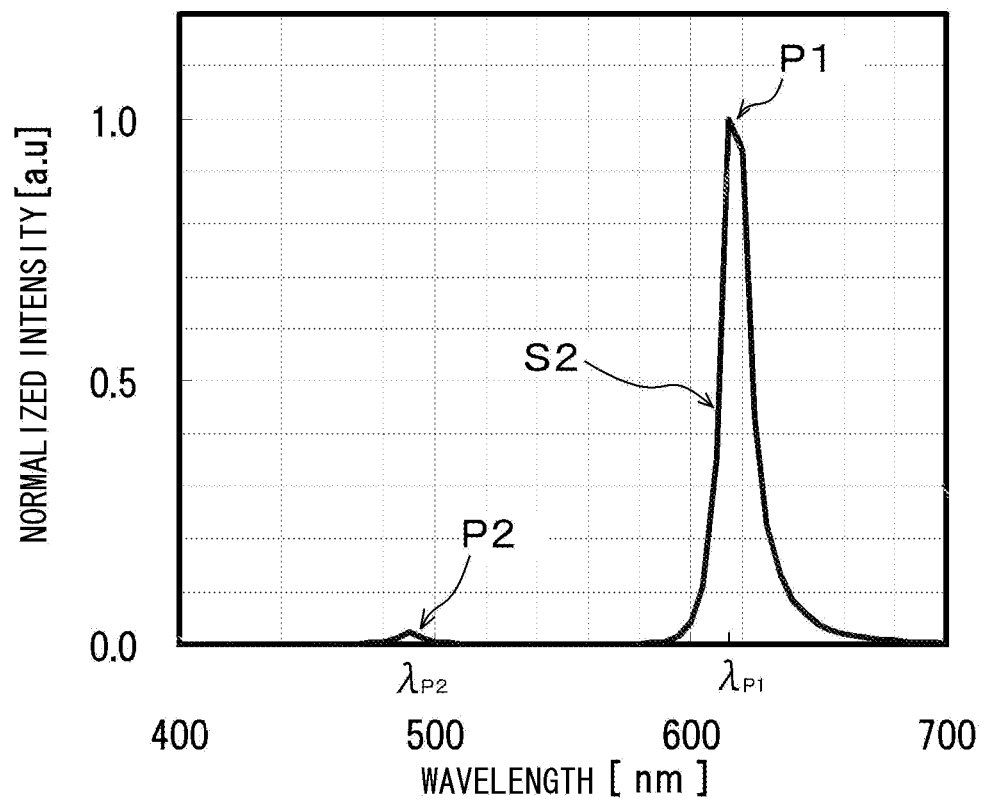
FIG. 8 is a diagram showing a light spectrum for red (R).

The present embodiment is a modification of the first embodiment, and is an embodiment directed to the light-emitting element for red (R) instead of the light-emitting element for blue (B). FIG. 7 shows an example of the resonance spectrum S1 having at least two or more peaks at respective wavelengths and the internal emission spectrum S3. FIG. 8 shows an example of the emission output spectrum S2 having at least two or more peaks at respective wavelengths based on the resonance spectral peaks.

That is, in a case of the light-emitting element for red (R), the emission output spectrum S2 has the primary peak P1 on the long wavelength side and has the secondary peak P2 on the short wavelength side with the central wavelength of the relative luminosity spectrum (i.e., 555 nm on the basis of photopic vision) being a border line as shown in FIG. 8. Here, the central wavelength of the primary peak P1 ($\lambda_{P1}$) preferably falls within a range of 620±20 nm, and the central wavelength of the secondary peak P2 ($\lambda_{P2}$) preferably falls within a range of 480±20 nm. Furthermore, as with the case of blue (B), a relative emission intensity of the secondary peak P2 with respect to the primary peak P1 is preferably 10% or smaller in view of the (integrated) intensity ratio with the primary peak P1, and more preferably 1 to 5%.

Furthermore, as with the case of blue (B), as a preferred emission intensity for achieving a color purity and compensating a luminance fluctuation, the emission intensity is preferably set so that a deviance $\Delta u'v'$ from an NTSC color purity of chromaticity coordinates falls in a predetermined range. That is, the emission intensity is set so that regarding a color purity for a single color of red, a deviance $\Delta u'v'$ from NTSC blue coordinates falls in a range of 0.05 or smaller, and preferably in a range of 0.02 or smaller.

Since it is configured, as described above, so that the primary peak P1 and the secondary peak P2 are formed with the central wavelength of the relative luminosity spectrum being a border line and the primary peak P1 and the secondary peak P2 are shifted synchronously in the same direction by an increase or a decrease in resonator optical path length, it is possible, as with the case of blue (B), to suppress a luminance fluctuation even if the central wavelengths of the peaks are shifted due to manufacturing errors, for example.

(Third Embodiment)

The first embodiment is directed to the light-emitting element for blue (B), and the second embodiment is directed to the light-emitting element for red (R). In a display device in which a display area is formed by a number of RGB light-emitting elements, however, it is possible to provide both of the light-emitting elements for blue (B) and red (R) described in the first and second embodiments. Thus, it is possible to suppress luminance fluctuations in both of blue (B) and red (R).

(Fourth Embodiment)

Figure 9:
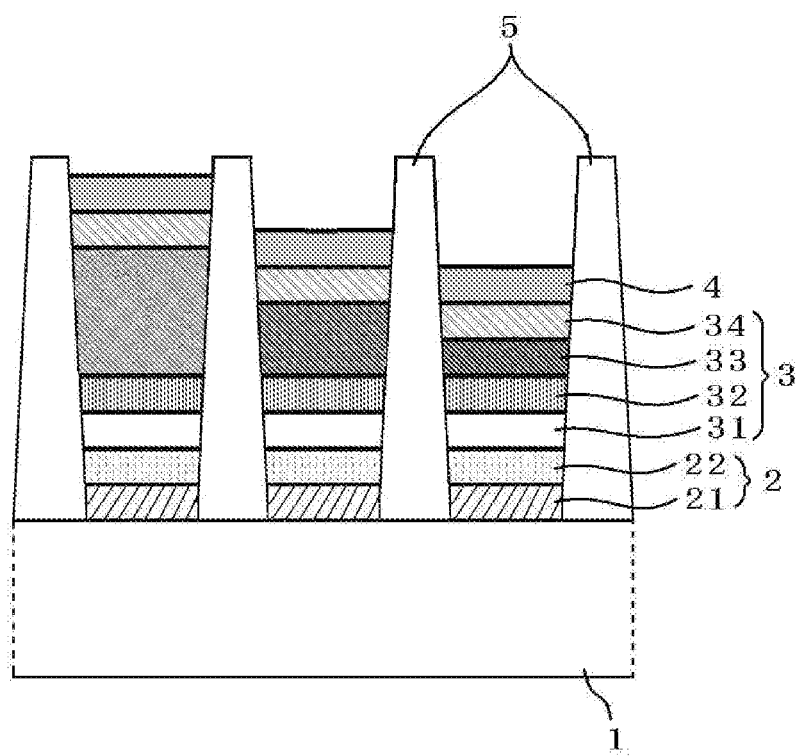
FIG. 9 is a vertical cross-sectional view of light-emitting elements according to a preferred fourth embodiment of the present invention.

Note that in the first to third embodiments, there has been described an example where RGB resonator optical path lengths are adjusted by changing a thickness of the hole-injection layer 31. However, the present invention is not limited thereto, and RGB resonator optical path lengths may be adjusted by changing a thickness of the light-emitting layer 33 as shown in FIG. 9.

(Fifth Embodiment)

Figure 10:
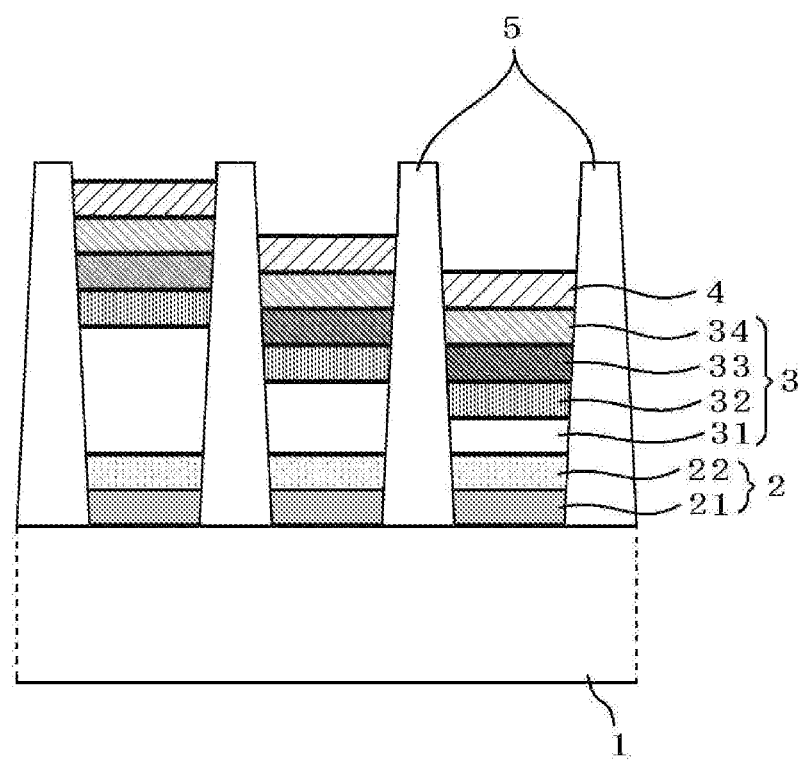
FIG. 10 is a vertical cross-sectional view of light-emitting elements according to a preferred fifth embodiment of the present invention.

Furthermore, in the first to fourth embodiments, there has been described the light-emitting element having the top emission structure as an example. However, the structure is not limited thereto, and it may be a bottom emission structure as shown in FIG. 10. FIG. 10 shows an example of the bottom emission structure obtained by forming the reflective electrode 21 in FIG. 1 as a semi-transmissive electrode and forming the cathode 4 as a reflective electrode. Note however that it is not limited to the structure shown in FIG. 10.

(Sixth Embodiment)

Next, an example of a procedure for manufacturing the RGB light-emitting elements shown in FIG. 1 will be described.

First, the reflective electrode 21 and the transparent electrode 22 are sequentially formed using vapor deposition, a sputtering method, or the like, for example. The patterning of these electrodes 21 and 22 can be performed by a photolithography method, for example. Next, a photosensitive resin containing a fluorine component, for example, is applied on the substrate 1 and dried to form a film. Thereafter, by using a photolithography method, for example, the partition walls 5 forming the pattern as shown in FIG. 1 are formed. For example, in a case of a passive type, after the electrodes 21 and 22 are formed in a stripe shape, the partition wall 5 is formed. On the other hand, in a case of an active type, for example, after the electrodes 21 and 22 are formed in an island shape connected for each drive circuit, the partition wall 5 is formed.

Next, a liquid material for the hole-injection layer 32 is applied within an area partitioned by the partition walls 5 by using an ink jet nozzle, for example, and dried to form a film. Also regarding the hole transport layer 32 and the light-emitting layer 33, a liquid material for each element is differently coated by a coating method in a similar manner to form films. The film thicknesses can be adjusted by an application quantity of the liquid material, for example. Next, the electron transport layer 34 and the cathode 4 are sequentially formed using a vapor deposition method. The patterning of the cathode 4 can be performed by using a mask such as a metal mask, or by utilizing the bank shape of the partition wall 5. On the other hand, in a case of an active type, for example, the cathode 4 can be made as what is called a plain electrode without performing patterning. Through such a procedure, the RGB light-emitting elements shown in FIGS. 1 and 2 can be manufactured.

As describe above, according to the first to sixth embodiments, the light-emitting element having the resonator structure is configured such that there are at least two or more resonance spectral peaks at respective wavelengths in a visible light range with the wavelength of the maximum value relative luminosity being a border line, and the emission output spectrum has at least two or more peaks at respective wavelengths based on the above-described resonance spectral peaks. As a result, it is possible to suppress a luminance fluctuation resulting from a variation in resonator optical path length. In other words, even if the film thickness is deviated from the designed value, the luminance fluctuation is small. This makes it possible to allow a variation in film thickness to some extent, and it is therefore possible to achieve an improvement in yield and a cost reduction.

The technique according to the embodiments described above can be applied to an inorganic thin-film light-emitting element having a stacked element structure (electroluminescence, light-emitting diode) in addition to an organic thin-film light-emitting element. The technique can also be applied to a light-emitting display device in which light-emitting elements are arranged in an array form on a surface.

Although the present invention has been described in detail based on the particular embodiments thereof, it is apparent to those skilled in the art that various substitutions, variations, modifications, and the like regarding its form and detail are possible without departing from the spirit and scope of the present invention as defined by the description of the claims. Therefore, it is to be understood that the scope of the present invention is not limited to the above-described embodiments and the accompanying drawings, and is determined based on the description of the claims and their equivalents.

The invention claimed is:

1. A light-emitting element comprising:
an anode having a reflective electrode and a transparent electrode;
a cathode; and
an organic layer provided between the anode and the cathode,
wherein the light-emitting element has a resonance spectrum having a primary resonance peak whose central wavelength is positioned on a long wavelength side with respect to a wavelength at which a relative luminosity takes a maximum value and a secondary resonance peak whose central wavelength is positioned on a short wavelength side with respect to the wavelength at which the relative luminosity takes the maximum value, and
the light-emitting element has an emission output spectrum having
a primary peak whose central wavelength positioned on a long wavelength side with respect to the wavelength at which the relative luminosity takes the maximum value and a secondary peak whose central wavelength is positioned on a short wavelength side with respect to the wavelength at which the relative luminosity takes the maximum value and which has an emission intensity smaller than that of the primary peak.

2. The light-emitting element according to claim 1, wherein the organic layer emits light having an internal emission spectrum which has a primary internal emission peak whose central wavelength is positioned on a long wavelength side with respect to the wavelength at which the relative luminosity takes the maximum value and a secondary internal emission peak whose central wavelength is positioned on a short wavelength side with respect to the wavelength at which the relative luminosity takes the maximum value and which has an emission intensity smaller than that of the primary internal emission peak, and the primary peak corresponds to the primary internal emission peak and the primary resonance peak, and the secondary peak corresponds to the secondary internal emission peak and the secondary resonance peak.

3. An organic electroluminescence display device comprising the light-emitting element according to claim 1.

4. The light-emitting element according to claim 1, wherein the emission intensity of the secondary peak is less than 10% of that of the primary peak.

* * * * *